(12) United States Patent
Van Der Pasch et al.

(10) Patent No.: US 7,177,059 B2
(45) Date of Patent: Feb. 13, 2007

(54) DEVICE AND METHOD FOR MANIPULATION AND ROUTING OF A METROLOGY BEAM

(75) Inventors: Engelbertus Antonius Fransiscus Van Der Pasch, Oirschot (NL); Marcel Hendrikus Maria Beems, Veldhoven (NL); Emiel Jozef Melanie Eussen, Margraten (NL); Engelbertus Johannes Jeroen Klijntunte, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/793,420

(22) Filed: Mar. 5, 2004

(65) Prior Publication Data

US 2004/0233494 A1   Nov. 25, 2004

(30) Foreign Application Priority Data

Mar. 6, 2003   (EP) .................................. 03075659

(51) Int. Cl.
  *G02B 26/08*   (2006.01)
(52) U.S. Cl. ...................................... 359/211; 359/834
(58) Field of Classification Search ................ 359/196, 359/209, 211–212, 223, 226, 833–834
  See application file for complete search history.

(56) References Cited

U.S. PATENT DOCUMENTS

| 5,229,872 A | 7/1993 | Mumola |
| 5,296,891 A | 3/1994 | Vogt et al. |
| 5,309,212 A * | 5/1994 | Clark ........................ 356/5.09 |
| 5,523,193 A | 6/1996 | Nelson |
| 5,535,041 A * | 7/1996 | Ayral et al. ................. 359/211 |
| 5,969,441 A | 10/1999 | Loopstra et al. |

(Continued)

FOREIGN PATENT DOCUMENTS

JP   2000-314609   11/2000

(Continued)

OTHER PUBLICATIONS

Marshall, F. Gerald, Risley Prism Scan Patterns, Jul. 21, 1999, Part of SPIE Conference on Optical Scanning: Design and Application Denver, Colorado, Jul. 1999 SPIE vol. 3787, pp. 74 and 75.*

(Continued)

*Primary Examiner*—Euncha P. Cherry
(74) *Attorney, Agent, or Firm*—Pillsbury Winthrop Shaw Pittman LLP

(57) ABSTRACT

A lithographic projection apparatus is equipped with a device for manipulation and routing of at least one portion of a metrology beam of radiation. The device includes a first and a second optical wedge, wherein the second optical wedge and the first optical wedge having a relative position with respect to each other. The at least one portion of the metrology beam enters the device along an incoming optical axis at a first major surface of the first optical wedge, passes through the first and second optical wedges, and exits at a second major surface of the second optical wedge. The first and second optical wedges are arranged to at least one of rotate and translate the at least one portion of the metrology beam relative to the incoming optical axis by changing the relative position of the first and the second optical wedges.

15 Claims, 2 Drawing Sheets

U.S. PATENT DOCUMENTS

| | | |
|---|---|---|
| 6,252,667 B1 | 6/2001 | Hill et al. |
| 6,778,280 B2 * | 8/2004 | De Groot et al. ........... 356/493 |
| 2001/0046345 A1 | 11/2001 | Snyder et al. |
| 2001/0050821 A1 * | 12/2001 | Bickleder et al. ........... 359/837 |

FOREIGN PATENT DOCUMENTS

| | | |
|---|---|---|
| JP | 2001-42223 | 2/2001 |
| JP | 2002-164268 | 6/2002 |
| WO | WO 98/33096 | 7/1998 |
| WO | WO 98/38597 | 9/1998 |
| WO | WO 98/40791 | 9/1998 |

OTHER PUBLICATIONS

Risley Prisms to Control Wave-Front Tilt and Displacement in a Vectorial Shearing Interferometer, pp. 1381-1384, Mar. 1, 2002.

Risley Prism Scan Patterns, pp. 74-86, Jul. 21, 1999.

European Search Report dated Dec. 17, 2003.

* cited by examiner

DEVICE AND METHOD FOR MANIPULATION AND ROUTING OF A METROLOGY BEAM

BACKGROUND OF THE INVENTION

1. Priority Information

This application claims priority from European Patent Application No. 03075659.7, filed Mar. 6, 2003, herein incorporated by reference in its entirety.

2. Field of the Invention

The present invention relates to a lithographic projection apparatus, and in particular, to a device for manipulating and routing a metrology beam of radiation and an associated device manufacturing method.

3. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

The term "patterning device" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning device include:

- a mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmission mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;
- a programmable mirror array: one example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as non-diffracted light. Using an appropriate filter, the said non-diffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation mechanism. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described here above, the patterning device can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the said support structure may be embodied as a frame or table, for example, which may be fixed or movable as required; and
- a programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as set forth here above.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features.

This array of procedures is used as a basis to pattern an individual layer of a device, e.g. an IC. Such a patterned layer may then undergo various processes such as etching, ion-implantation (doping), metallization, oxidation, chemical-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

In lithographic projection apparatus, various interferometers typically share the same light source, such as a laser, which produces a laser projection beam. It is to be noted that this shared laser projection beam does not relate to the projection beam as described above for the purpose of projecting a pattern of the patterning device onto a substrate. The shared laser projection beam will further be referred to herein as a metrology beam.

To share the metrology beam throughout the lithographic projection apparatus, the metrology beam is routed through the apparatus to reach each interferometer. To prevent second order measurement errors and loss of range in the interferometers (and consequently causing inaccuracies in the use of the lithographic projection apparatus), it is important to accurately align (in the order of µrad) the metrology beam to the measurement object (e.g., a stage). After beam alignment, the interferometer system is calibrated. All relevant parameters (relating to angular and lateral position of the beam) are determined and are assumed to be stable in time.

Between calibrations, the stability of components for routing the metrology beam that can influence the alignment parameters (especially, beam bender manipulators) is very important. For example, if alignment parameters change during operation (e.g., due to drift), the accuracy of the lithographic projection apparatus may he affected. Therefore, the stability of the routing components is an important issue in relation to the measurement accuracy of an interferometer system.

Routing and manipulation of metrology beams is typically done by an arrangement comprising an adjustable mirror which can modify the pointing direction of a metrology beam impinging on it. Using such an adjustable mirror has a disadvantage due to the fact that rotation and/or tilt of the mirror (which two operations have an inherent instability) can lead to an inaccurate pointing of the beam. The beam alignment is thus prone to uncertainties relating to a rotation error and a tilting error.

SUMMARY OF THE INVENTION

The principles of the present invention, as embodied and broadly described herein, provide a device for manipulation and routing of a metrology beam which has an improved stability over conventional devices.

In one embodiment, a lithographic projection apparatus is presented, which comprises a radiation system for supplying a projection beam of radiation, a support structure for supporting patterning device, which serves to pattern the projection beam according to a desired pattern, a substrate table for holding a substrate, a projection system for projecting the patterned beam onto a target portion of the substrate, and a device for manipulation and routing of at least one portion of a metrology beam of radiation. The device comprises a first and a second optical wedge, the second optical wedge and the first optical wedge having a relative position with respect to each other, the at least one portion of the metrology beam entering the device along an incoming optical axis at a first major surface of the first optical wedge, passing through the first and second optical wedges, and exiting at a second major surface of the second optical wedge, the first and second optical wedges being arranged to at least one of rotate and translate the at least one portion of the metrology beam relative to the incoming optical axis by changing the relative position of the first and the second optical wedges.

The large ratio between mechanical adjustments made in the manipulating device and their influence on the beam's angular and lateral position leads to a high adjustment resolution and a low sensitivity to mechanical changes and/or instabilities. Adjustments of the device for the alignment of the beam are done along major axes of the device, which results in an improved stability of the alignment. As an advantage, this leads to calibrations of the pointing direction which remain accurate over a longer term, before re-calibration may be necessary. Because of the long term stability of the device for manipulation and routing of a metrology beam, the accuracy improvement within a lithographic projection apparatus can be up to 2–3 nm/3 months. Of course, the device could applied in other applications, such as machining.

Furthermore, the improved adjustment resolution can lead to a cycle time reduction during manufacturing since the adjustment can be performed in a relatively simpler and less time-consuming way than in the prior art.

Another embodiment relates to a lithographic projection apparatus comprising a device for manipulation and routing of at least one portion of a metrology beam of radiation, the device comprising a first and a second optical wedge, at least one of a first and second major surface of the second optical wedge being provided with a reflective coating, the second optical wedge and the first optical wedge having a relative position with respect to each other, the at least one portion of the metrology beam entering the device along an incoming optical axis at a first major surface of the first optical wedge, passing through the first optical wedge, entering on one of the first and second major surface of the second optical wedge and reflecting at the one of the first and second major surface of the second optical wedge, the first and second optical wedges being arranged to at least one of rotate and translate the at least one portion of the metrology beam relative to the incoming optical axis by changing the relative position of the first and the second optical wedges.

Furthermore, the present invention relates to a device for manipulation and routing of at least one portion of a metrology beam of radiation, characterized in that the device comprises a first and a second optical wedge, the second optical wedge and the first optical wedge having a relative position with respect to each other, the at least one portion of the metrology beam entering the device along an incoming optical axis at a first major surface of the first optical wedge, passing through the first and second optical wedges, and exiting at a second major surface of the second optical wedge, the first and second optical wedges being arranged to at least one of rotate and translate the at least one portion of the metrology beam relative to the incoming optical axis by changing the relative position of the first and the second optical wedges.

According to another embodiment of the present invention, there is provided a device manufacturing method comprising: providing a metrology beam of radiation using a radiation system, entering at least one portion of the metrology beam along an incoming optical axis at a first major surface of a first optical wedge, passing the at least one portion of the metrology beam through the first optical wedge and through a second optical wedge, the second optical wedge and the first optical wedge having a relative position with respect to each other, exiting the at least one portion of the metrology beam at a second major surface of the second optical wedge, and at least one of rotating and translating the at least one portion of the metrology beam relative to the incoming optical axis by changing the relative position of the first and the second optical wedge.

The present invention may be applied in a beam steering device which combines a device for manipulation and routing of the metrology beam with a fixed mirror. Prior art beam bender manipulators that had less stability due to the fact that the bending action by the prior art beam bender manipulator occurred around a line which is substantially parallel to the adjustment axis of the manipulator. In the present invention, the beam steering device has an adjustment axis which is substantially perpendicular to the bending line, which by consequence yields a higher stability for the settings of the device.

Furthermore, the present invention provides a beam steering device which omits the fixed mirror and comprises only two optical wedges for manipulation and routing. In that case the stability of the settings is even improved further.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The person skilled in the art will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "projection beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm). The metrology beam may comprise any type of electromagnetic radiation having a wavelength suitable for metrology purposes.

BRIEF DESCRIPTION OF DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Lithographic Apparatus

Figure 1:
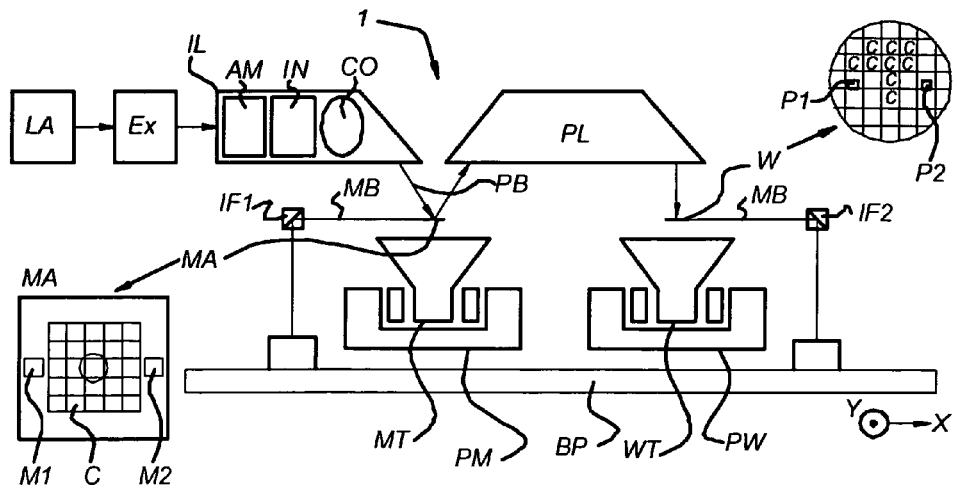
FIG. 1 depicts a lithographic projection apparatus.

FIG. 1 schematically depicts a lithographic apparatus according to a particular embodiment of the invention. The apparatus comprises:

a radiation system Ex, IL: for supplying a projection beam PB of radiation (e.g. UV radiation). In this particular case, the radiation system also comprises a radiation source LA;

a first object table (mask table) MT: provided with a mask holder for holding a mask MA (e.g. a reticle), and connected to first positioning mechanism PM for accurately positioning the mask with respect to item PL;

a second object table (substrate table) WT: provided with a substrate holder for holding a substrate W (e.g. a resist-coated silicon wafer), and connected to second positioning mechanism PW for accurately positioning the substrate with respect to item PL; and a projection system ("lens") PL: for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

The source LA (e.g. a mercury lamp or an excimer laser) produces a beam of radiation. This beam is fed into an illumination system (illuminator) IL, either directly or after having traversed conditioning mechanism, such as a beam expander Ex, for example. The illuminator IL may comprise adjusting mechanism AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning mechanism PW and interferometric measuring mechanism, the substrate table WT can be moved accurately, e.g. so as to position different target portions C in the path of the beam PB. Similarly, the first positioning mechanism PM can be used to accurately position the mask MA with respect to the path of the beam PB, e.g. after mechanical retrieval of the mask MA from a mask library, or during a scan. In general, movement of the object tables MT, WT will be realised with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

step mode: the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

scan mode: the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

EMBODIMENTS

The interferometric measuring mechanism typically can comprise a light source, such as a laser (not shown), and one or more interferometers for determining some information (e.g., position, alignment, etc.) regarding an object to be measured, such as a substrate or a stage. In FIG. 1, for example, two interferometers IF1 and IF2 are schematically depicted. The light source (laser) produces a metrology beam MB which is routed to the interferometer(s) IF1, IF2 by one or more beam manipulators. In case more than one interferometer is present, the metrology beam is shared between them, by using optics that split the metrology beam in various separate beams for each interferometer. In FIG. 1, for example, shows the metrology beam split into two beams. The splitter optics are not shown. A beam manipulator may also be used in the interferometer itself.

Figure 2:
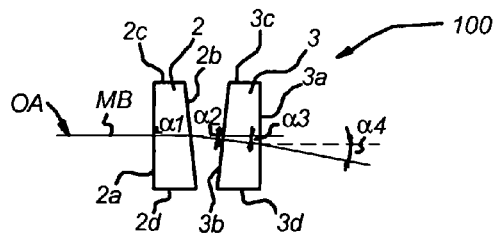
FIG. 2 schematically shows a device for manipulation and routing of a metrology beam according to an embodiment of the present invention and a first operation of the device.

FIG. 2 schematically shows a cross-section of a device for manipulation and routing of a metrology beam according to an embodiment of the present invention and a first operation of the device.

The device 100 for manipulation and routing of a metrology beam MB comprises first and second optical elements known as optical wedges 2, 3. Each of the first and second optical wedges 2, 3 comprises two minor surfaces 2c, 2d, and 3c, 3d, respectively. In each optical wedge, the two minor surfaces are substantially parallel, with 2d and 3d being the minor surface having a relatively larger area than the other minor surface 2c and 3c, respectively. Each of the optical wedges further comprise two major surfaces 2a, 2b and 3a, 3b, respectively. The major surfaces each extend from one minor surface to the other minor surface, with the two major surfaces not being parallel to each other.

In the embodiment shown in FIG. 2, the major surface 2a, 3a extends in a direction substantially perpendicular to the two minor surfaces 2c, 2d and 3c, 3d respectively. The other major surface 2b, 3b is slanted relative to the surfaces 2a, 2c, 2d, and 3a, 3c, 3d respectively. The device 100 further comprises an optical axis OA which is substantially perpendicular to the major surface 2a of the first optical wedge 2 and the major surface 3a of the second wedge 3.

It is noted that each of the optical wedges 2, 3 may be used with its respective major slanted surface 2b, 3b towards the incoming beam and the outgoing beam, respectively.

During operation, a metrology beam, such as a laser beam, travels in a direction substantially parallel to the optical axis OA, enters the first optical wedge 2 at major surface 2a, and is refracted at the major surface 2a over a first in-plane angle α1 relative to the optical axis OA of the incoming beam. Subsequently, the beam passes through the first wedge 2, exits at the slanted major surface 2b, and is again refracted over a second in-plane angle α2 relative to the optical axis OA of the incoming beam.

Since in this case as an example the metrology beam MB enters the major surface 2a under substantially normal incidence, the first in-plane angle α1 is substantially equal to 0° to the optical axis OA. Next the metrology beam MB enters the slanted major surface 3b of the second optical wedge 3 and is again refracted over a third in-plane angle α3 relative to the optical axis OA of the incoming beam. Again refraction occurs while the beam passes the major surface 3a, and the metrology beam exits the second optical wedge 3 under a fourth in-plane angle α4 relative to the optical axis OA of the incoming beam.

In FIG. 2, since all surfaces 2a, 2b and 3a, 3b are substantially perpendicular to the plane of the cross-section in FIG. 2, the metrology beam exiting the second optical wedge is substantially parallel to that plane.

By changing the angular position of the second optical wedge 3 around the optical axis OA over an axial angle β (not shown), the orientation of the surfaces of the second optical wedge 3 can be changed in such a way that the surface 3b is not perpendicular to the plane of the cross-section in FIG. 2. As a result, the optical path of the metrology beam comprises an angle in a direction out of the plane of the cross-section in FIG. 2. Alternatively, the first optical wedge 2 may be rotated around the optical axis OA to result in the metrology beam comprising an angle in a direction out of the plane of the cross-section of FIG. 2. In each of the cases of rotating the first optical wedge 2 or the second optical wedge 3, the other optical wedge—the second optical wedge 3 or the first optical wedge 2, respectively—is not rotated. In another alternative, both the first optical wedge and the second optical wedge may be rotated to effect an angle for the metrology beam out of the plane of the cross-section of FIG. 2.

The change of the angular position of an optical wedge around the optical axis OA is a first operation for the device 100.

Figure 3:
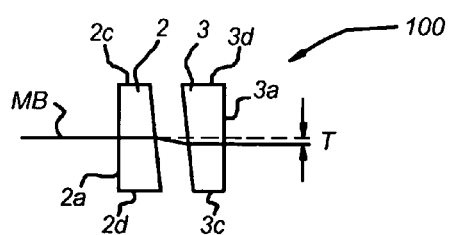
FIG. 3 schematically shows a second operation for manipulation of the metrology beam by the device according to an embodiment of the present invention.

FIG. 3 schematically shows a special case of the first operation for manipulation of the metrology beam MB by the device according to an embodiment of the present invention.

A special case of the first operation occurs when the second optical wedge 3 is rotated over an axial angle β of 180° relative to the initial position as shown in FIG. 2. When the geometry of the major surfaces of the first and second optical wedge 2, 3 is substantially identical, the relative positions as shown in FIG. 3 result in an exiting metrology beam which is substantially parallel to the incoming beam, but translated over a distance T with respect to the optical axis OA. (The fourth in-plane angle α4 in this figure equals zero.) Alternatively, the first optical wedge 2 may be rotated over an axial angle β of 180° relative to the initial position as shown in FIG. 2.

Figure 4:
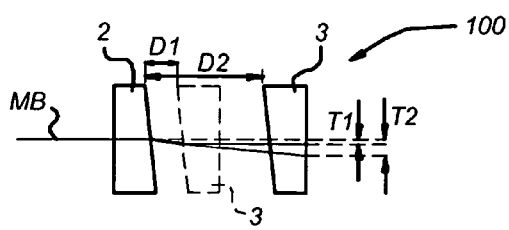
FIG. 4 schematically shows a third operation for manipulation of the metrology beam by the device according to an embodiment of the present invention.

FIG. 4 schematically shows a second operation for manipulation of the metrology beam MB by the device according to an embodiment of the present invention.

The second operation occurs when in case of the angular position of the first and second optical wedges 2, 3 as shown in FIG. 3, a distance D between the first and second optical wedges 2, 3 is changed. As shown by the construction in the diagram of FIG. 4 a shift of the lateral position (D2-D1) between the wedges 2, 3 changes the translation (T2-T1) of the metrology beam MB relative to the optical axis accordingly. A shorter distance between the optical wedges 2, 3 results in a smaller translation of the metrology beam relative to the optical axis OA, a larger distance in a larger translation.

A third operation occurs when the complete device i.e., the ensemble of the wedges 2, 3, is rotated around the optical axis OA, with the positions of the first and second optical wedges being fixed relative to each other (i.e., the device comprises a combination of a constant axial angle P for each wedge and a constant distance D between the wedges 2, 3). The exiting metrology beam having in-plane angle α4 is rotated around the optical axis OA, describing a circular path of projection around the optical axis OA. So, for example, a rotation of the complete device of 180° around the optical axis OA would result in the entire metrology beam having an in-plane angle of −α4 relative to the optical axis OA.

Figure 5:
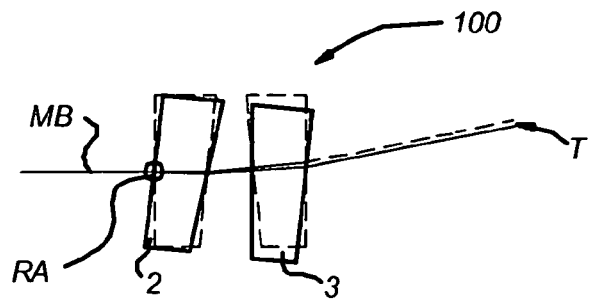
FIG. 5 schematically shows a fourth operation for manipulation of the metrology beam by the device according to an embodiment of the present invention.

FIG. 5 schematically shows a fourth operation for manipulation of the metrology beam by the device according to an embodiment of the present invention.

The fourth operation occurs when the device is rotated around a rotation axis perpendicular to the optical axis OA, with the positions of the first and second optical wedges 2, 3 being fixed relative to each other. The rotation axis is chosen perpendicular to the plane of the cross-section of FIG. 2 (and FIG. 5), as indicated by rotation axis symbol RA. In FIG. 5 the device 100 is shown in an initial position drawn in dashed lines and in a second rotated position drawn by a continuous line. The initial optical path is shown also by a dashed line. The second optical path after rotation around the rotation axis RA is shown by a continuous line MB. As can be deduced from FIG. 5 a rotation around axis RA results in a translation of the metrology beam parallel to the plane of the cross-section of FIG. 2 (and FIG. 5).

As will be appreciated by persons skilled in the art, various possible combinations of the first, second, third, and fourth operations allow angular and translational control over the position and direction of a metrology beam.

Additionally, because the first, second and third operations occur relative to the optical axis OA, a shift of the beam perpendicular to that direction has substantially no effect on the direction of the metrology beam MB as such. This contributes to a relatively higher stability of this device in comparison to devices from the prior art. Furthermore, since the fourth operation only changes the direction of the metrology beam in a plane parallel to the cross-section, this fourth operation does not introduce any misalignment of the metrology beam in a direction out of the cross-sectional plane. Therefore, the design of the disclosed device for manipulation and routing of a metrology beam is relatively stable, compact, and cost-effective.

It is noted that preferably the two optical wedges 2, 3 are a matched pair to reach a maximal manipulation range. If the optical wedges 2,3 are slightly different, an angle of zero degrees between incoming and outgoing beam may not be obtainable.

In the following figures some examples of beam manipulators for use in e.g., lithographic projection apparatus are shown that are based on the device as described above in FIGS. 2–5.

Figure 6A:
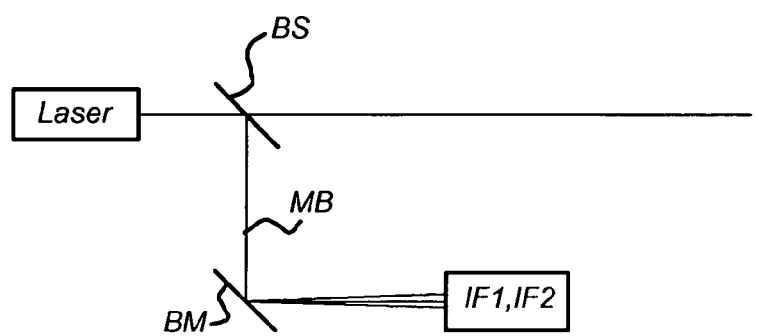
FIGS. 6a and 6b schematically show an exemplary routing of a metrology beam to an interferometer according to a typical arrangement, and an embodiment of the present invention, respectively.
Figure 6B:
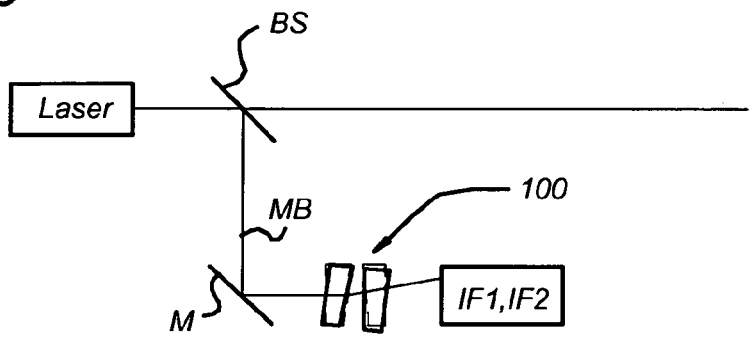

FIGS. 6a and 6b schematically show an exemplary routing of a metrology beam to an interferometer according to a typical embodiment, and according to an embodiment of the present invention, respectively.

In FIG. 6a, a laser source generates a metrology beam MB which impinges on a fixed beam splitter BS. The fixed beam splitter BS splits the beam MB in a first portion for measurement by an interferometer detector IFM and a further portion for projection on an object to be measured such as a substrate or a stage. The first portion impinges on a beam bender manipulator BM for directing the first beam portion to the interferometer detector IFM. The beam bender manipulator BM typically comprises a rotatable mirror with a rotation axis perpendicular to the plane of the drawing. The rotating mirror is set in such a way to obtain an optimal signal on the interferometer detector IFM. Such a set-up procedure is well known in the art. As indicated schematically in FIG. 6a by the three lines aimed at the interferometer detector IFM, the alignment of the beam is influenced by the stability of the setting of the beam manipulator BM.

In FIG. 6b an alternative arrangement is shown which employs the device 100 for manipulating and routing of the metrology beam. In FIG. 6b the same references indicate identical elements as shown in FIG. 6a.

The beam manipulator BM is in this alternative arrangement replaced by the device 100 for manipulating and routing of the metrology beam, in combination with a fixed mirror M. After splitting at the beam splitter BS, a first portion of the beam MB impinges on the fixed mirror M and is reflected in the direction of device 100. After passing through the device 100 the first portion of the beam MB reaches the interferometer detector IFM. The device 100 can be set to manipulate the first portion of the beam MB by any combination of the four operations as described above with reference to FIGS. 2 to 5. In FIG. 6b the fourth operation is illustrated schematically by a position drawn in a continuous line and a further position drawn in a dashed line.

The arrangement according to FIG. 6b has a higher stability than in FIG. 6a since the mirror M has a fixed position with a fixed alignment. Further, the design of device 100 offers a relatively high stability as already described above.

In FIG. 6b the 'three component configuration' comprising a fixed mirror M and two optical wedges 2, 3 is shown. An alternative embodiment can be obtained wherein the fixed mirror M is omitted.

Figure 7:
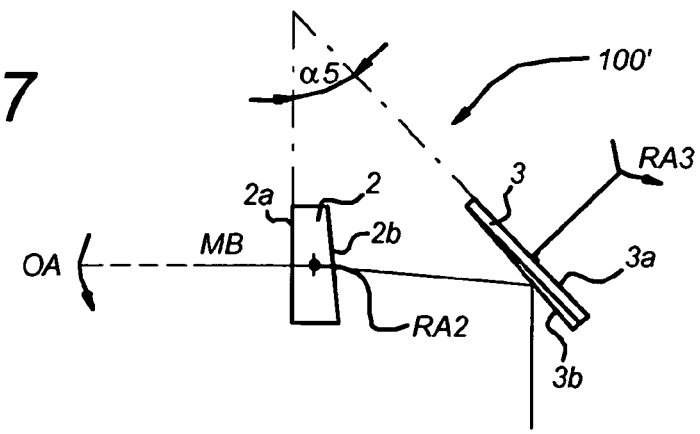
FIG. 7 schematically shows a further embodiment of the device according to the present invention.

FIG. 7 schematically shows a further embodiment of the device 100' according to the present invention.

The combination of a fixed mirror M and a device 100 for manipulating and routing of the metrology beam may be replaced by a single device 100' according to an embodiment of the present invention.

In this embodiment the first optical wedge 2 and the second optical wedge 3 are arranged to have an angle α5 between their respective major surfaces 2a and 3a. A metrology beam MB impinges under normal incidence on the slanted major surface 2b of the first optical wedge 2. Next, upon exiting the slanted major surface 2b, the beam refracts and impinges on the slanted major surface of the second optical wedge 3. Since the angle of incidence between the incoming beam and the slanted major surface of the second optical wedge 3 is smaller than the critical angle, the beam portion reflects on the slanted major surface 3b and is directed in a further direction. In this embodiment of the device 100', the first optical wedge 2 is adjustable by rotation around the optical axis OA and around a second rotation axis substantially perpendicular to the plane of the drawing, as indicated by axis symbol RA2. The second optical wedge 3 can be rotated around a third rotation axis RA3 which is substantially in the plane of the drawing and substantially normal to the major surface 3a of the second wedge 3.

The adjustment around the second rotation axis RA2 of the first optical wedge 2 is the operation most likely to cause a mechanical instability. Since the rotation axis RA2 is normal to the bending which occurs substantially in the plane of the drawing, stability regarding the setting of the beam direction is still guaranteed.

As will be appreciated by persons skilled in the art, the device 100' of this embodiment is capable of performing operations similar to the operations of the device 100 as described above with reference to the FIGS. 2 to 5.

It is noted that the second optical wedge 3 may comprise a reflective coating on at least one of its major surfaces 3a, 3b to obtain reflection of the metrology beam at the slanted major surface 3b. In that case, the angle of incidence of the beam may be larger than the critical angle.

Whilst specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A lithographic apparatus, comprising:
   an interferometric system including a radiation source that generates a metrology beam;
   a first optical wedge;
   a second optical wedge, said first and second optical wedges having a relative position with respect to each other, wherein the first and second optical wedges are configured to rotate around a rotation axis that is perpendicular to an optical axis;
   wherein at least a portion of said metrology beam propagates along an incoming optical axis at a first major surface of said first optical wedge, passes through said first and second optical wedges, and exits at a second major surface of said second optical wedge, and
   wherein said first and second optical wedges are configured to perform at least one of a rotation and a translation of at least the portion of said metrology beam relative to said incoming optical axis by changing said relative position of said first and second optical wedges.

2. The lithographic apparatus of claim 1, wherein at least one of said first and second optical wedges are rotated over an axial angle around said optical axis.

3. The lithographic apparatus of claim 2, wherein at least one of said first and second optical wedges are displaced along said optical axis to change a distance between them.

4. The lithographic apparatus of claim 3, wherein said first and second optical wedges have a fixed relative position with a fixed axial angle and fixed distance, and said first and second optical wedges are rotated in combination around said optical axis.

5. The lithographic apparatus of claim 4, wherein said first and second optical wedges have the fixed relative position with the fixed axial angle and fixed distance, and said first and second optical wedges are rotated in combination around a rotating axis normal to said optical axis.

6. A lithographic apparatus, comprising:
   an interferometric system including a radiation source that generates a metrology beam;
   a first optical wedge;
   a second optical wedge in which one of a first and second major surface of said second optical wedge is provided with a reflective coating, said first and second optical wedges having a relative position with respect to each other, wherein the first and second optical wedges are configured to rotate around a rotation axis that is perpendicular to an optical axis;
   wherein at least one portion of said metrology beam propagates along an incoming optical axis at a first major surface of said first optical wedge, passes through said first optical wedge, and reflects from said one of said first and second major surfaces of said second optical wedge, and
   wherein said first and second optical wedges are configured to perform at least one of rotation and a translation of said at least portion of said metrology beam relative to said incoming optical axis by changing said relative position of said first and said second optical wedges.

7. The lithographic apparatus of claim 6, wherein at least one of said first and second optical wedges are rotated over an axial angle around said optical axis.

8. The lithographic apparatus of claim 6, wherein said second optical wedge is rotated over an angle around a rotation axis that is substantially perpendicular to said first major surface of said second optical wedge.

9. The lithographic apparatus of claim 8, wherein at least one of said first and second optical wedges are displaced along said optical axis to change a distance between them.

10. The lithographic apparatus of claim 9, wherein said first and second optical wedges have a fixed relative position with a fixed axial angle and fixed distance, and said first and second optical wedges are rotated in combination around said optical axis.

11. The lithographic apparatus of claim 10, wherein said first and second optical wedges have the fixed relative position with the fixed axial angle and fixed distance, and said first and second optical wedges are rotated in combination around a rotating axis normal to said optical axis.

12. A device for manipulating and routing at least a portion of a metrology beam of an interferometer system, comprising:
- a first optical wedge;
- a second optical wedge, said second optical wedge and said first optical wedge having a relative position with respect to each other, wherein the first and second optical wedges are configured to rotate around a rotation axis that is perpendicular to an optical axis;
- wherein said at least one portion of said metrology beam enters said device along an incoming optical axis at a first major surface of said first optical wedge, passes through said first optical wedge and said second optical wedge, and exits at a second major surface of said second optical wedge, and
- wherein said first and second optical wedges are configured to perform to at least one of rotation and a translation of said at least one portion of said metrology beam relative to said incoming optical axis by changing said relative position of said first and said second optical wedges.

13. A device for manipulating and routing at least a portion of a metrology beam of an interferometer system, said device comprising:
- a first optical wedge,
- a second optical wedge in which one of a first and second major surface of said second optical wedge is provided with a reflective coating, said second optical wedge and said first optical wedge having a relative position with respect to each other, wherein the first and second optical wedges are configured to rotate around a rotation axis that is perpendicular to an optical axis;
- wherein said at least one portion of said metrology beam enters said device along an incoming optical axis at a first major surface of said first optical wedge, passes through said first optical wedge, and reflects from said one of said first and second major surfaces of said second optical wedge, and
- wherein said first and second optical wedges are configured to perform at least one of rotation and a translation of said at least one portion of said metrology beam relative to said incoming optical axis by changing said relative position of said first and said second optical wedges.

14. A device manufacturing method, comprising:
- radiating an interferometric metrology beam, at least one portion of said metrology beam entering a first major surface of a first optical wedge along an incoming optical axis;
- passing said at least one portion of said metrology beam through said first optical wedge and through a second optical wedge, said second optical wedge and said first optical wedge having a relative position with respect to each other;
- enabling the first and second optical wedges to rotate around a rotation axis that is perpendicular to the incoming optical axis;
- exiting said at least one portion of said metrology beam at a second major surface of said second optical wedge; and
- performing at least one of rotation and translation of said at least one portion of said metrology beam relative to said incoming optical axis by changing said relative position of said first and said second optical wedges.

15. A device manufacturing method, comprising:
- radiating an interferometric metrology beam, at least one portion of said metrology beam entering a first major surface of a first optical wedge along an incoming optical axis;
- passing said at least one portion of said metrology beam through said first optical wedge;
- reflecting said at least one portion of said metrology beam at one of a first and second major surface of said second optical wedge, said second optical wedge and said first optical wedge having a relative position with respect to each other;
- enabling the first and second optical wedges to rotate around a rotation axis that is perpendicular to the incoming optical axis; and
- performing at least one of rotation and translation of said at least one portion of said metrology beam relative to said incoming optical axis by changing said relative position of said first and said second optical wedges.

* * * * *